United States Patent [19]

Olsen et al.

[11] Patent Number: 5,221,907
[45] Date of Patent: Jun. 22, 1993

[54] PSEUDO LOGARITHMIC ANALOG STEP ADDER

[75] Inventors: Floyd W. Olsen, Athens, Pa.; Edward J. Tasillo, Newark Valley, N.Y.

[73] Assignee: International Business Machines Corporation, Armonk, N.Y.

[21] Appl. No.: 709,470

[22] Filed: Jun. 3, 1991

[51] Int. Cl.⁵ .................. G06G 7/24; G06G 7/12; G06G 7/00
[52] U.S. Cl. ............... 328/145; 307/492; 307/529; 328/143
[58] Field of Search ............ 307/490, 492, 529; 328/142, 143, 145; 324/115; 330/124 R, 295

[56] References Cited

U.S. PATENT DOCUMENTS

| | | | |
|---|---|---|---|
| 3,435,353 | 3/1969 | Sauber | 307/492 |
| 3,448,289 | 6/1969 | Harris | 307/492 |
| 3,978,423 | 8/1976 | Bench | 330/124 R |
| 4,131,846 | 12/1978 | Stone | 324/115 |
| 4,531,069 | 7/1985 | Parker | 307/492 |
| 4,565,935 | 1/1986 | Rolfe | 328/145 |
| 4,598,252 | 7/1986 | Andricos | 330/124 |
| 4,908,529 | 3/1990 | Aitchison | 328/145 |
| 4,972,512 | 11/1990 | Garskamp | 307/490 |
| 4,990,803 | 2/1991 | Gilbert | 307/492 |
| 5,012,140 | 4/1991 | Bateman | 328/145 |

OTHER PUBLICATIONS

Damijanovic, "Quasi-logarithmic system for measuring dc current", Aug. 1976, pp. 33–35.

Primary Examiner—Jin F. Ng
Assistant Examiner—Sinh Tran
Attorney, Agent, or Firm—William H. Steinberg

[57] ABSTRACT

A signal to be scaled is supplied to three parallel amplifiers with gains of 0.1, 1, and 10, which each amplify the input simultaneously. The amplifiers are designed so that their output is limited to 1 volt regardless of the level of voltage at their input. This allows the lower magnitude portions of the signals to be amplified without amplifying the higher magnitude signals. The output of the amplifiers are summed together to provide the scaled signal.

16 Claims, 4 Drawing Sheets

PSEUDO LOGARITHMIC ANALOG STEP ADDER

BACKGROUND OF THE INVENTION

The present invention relates to signal range expansion converters and more particularly to a converter which scales different orders of magnitudes differently so that the lower orders of magnitude receive the most amplification.

When measuring signals having a broad range of values, conventional scaling by linearly compressing the entire range results in signals at the lower end of the range where system noise can exceed 10% of the desired signals value, making accurate measurements extremely difficult. When the linearly compressed signals are applied to an analog to digital (A/D) converter the offset voltage of the A/D converter can cause a portion of the lower end of the range to be lost.

In many applications a signal must be quickly measured so that the desired value, which is changing rapidly, can be captured and converted.

Logarithmic amplifiers can be used when signals with a large dynamic range are encountered to provide compression of the signal range. It is necessary to take the antilog of the output of the amplifier in order to obtain the natural number associated with the output of the scaled signal.

It is an object of the present invention to provide a converter for scaling a range of input signals which quickly captures and converts the value to be measured.

It is a further object of the present invention to provide a converter for scaling a range of input signals, the output of which can be easily interpreted.

SUMMARY OF THE INVENTION

In one aspect of the present invention, a converter for scaling an input signal is provided, including a plurality of amplifier means having different gains. Each of the amplifiers is connectable to simultaneously receive the input signal. Limit network means are connected to the output of each of the amplifier means for limiting the maximum output values to a predetermined value. Adder means for summing the output of all the limit network means is also provided, whereby the output of the adder means is a scaled output signal.

DETAILED DESCRIPTION OF THE PREFERRED EMBODIMENTS

Figure 1:
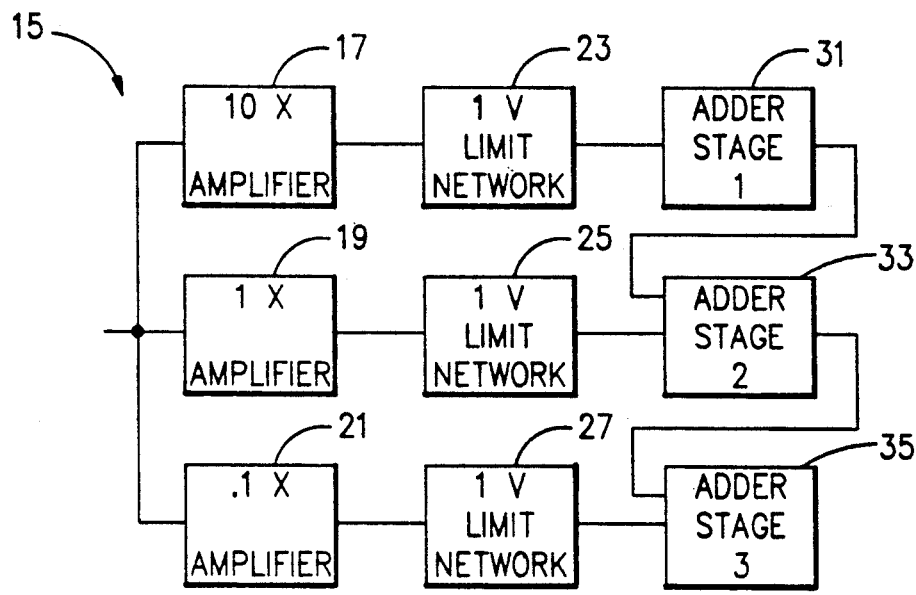
FIG. 1 is a block diagram representation of a converter in accordance with the present invention.
Figure 3:
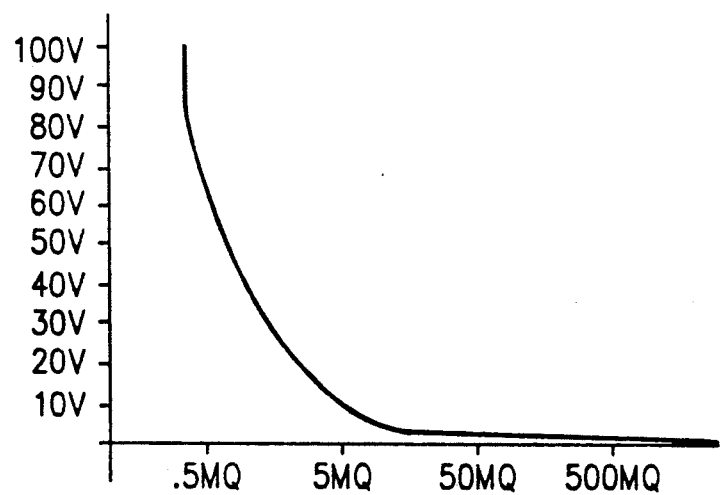
FIG. 3 is a graph of a range of signals and the resistances to which they correspond.

The signal to be captured and scaled is supplied to the input of a converter 15 which functions as a psuedo logarithmic analog step adder (PLASA). The signal can be amplified prior to being applied to the PLASA to achieve a signal range which can be accommodated by the PLASA, by linearly scaling the signal so that it falls in a predetermined range, for example, 10 volts or less in the present embodiment. Three parallel amplifiers 17, 19, and 21 with gains of 10, 1, and 0.1, respectively, each amplify the input signal simultaneously. The output of each of the amplifiers 17, 19, and 21 is limited to 1 volt by 1 volt limit networks 23, 25, and 27, respectively. The limit networks provide a maximum output of 1 volt regardless of how much greater than 1 volt the input to the limit network is. If the output of the amplifier is less than 1 volt, that voltage is provided at the output of the limit network unchanged. The three amplifier outputs 17, 19, and 21 after being limited by limit networks 23, 25, and 27, are each connected to an adder stage 31, 33, and 35, respectively, of a three stage adder. The output of the first adder stage 31 is summed with the output of the second adder stage 33. The output of the second adder stage 33 is summed with the output of the third adder stage 35. The output of the third adder stage stage provides the sum of the outputs of the three limit networks and serves as the output of the PLASA.

Figure 2:
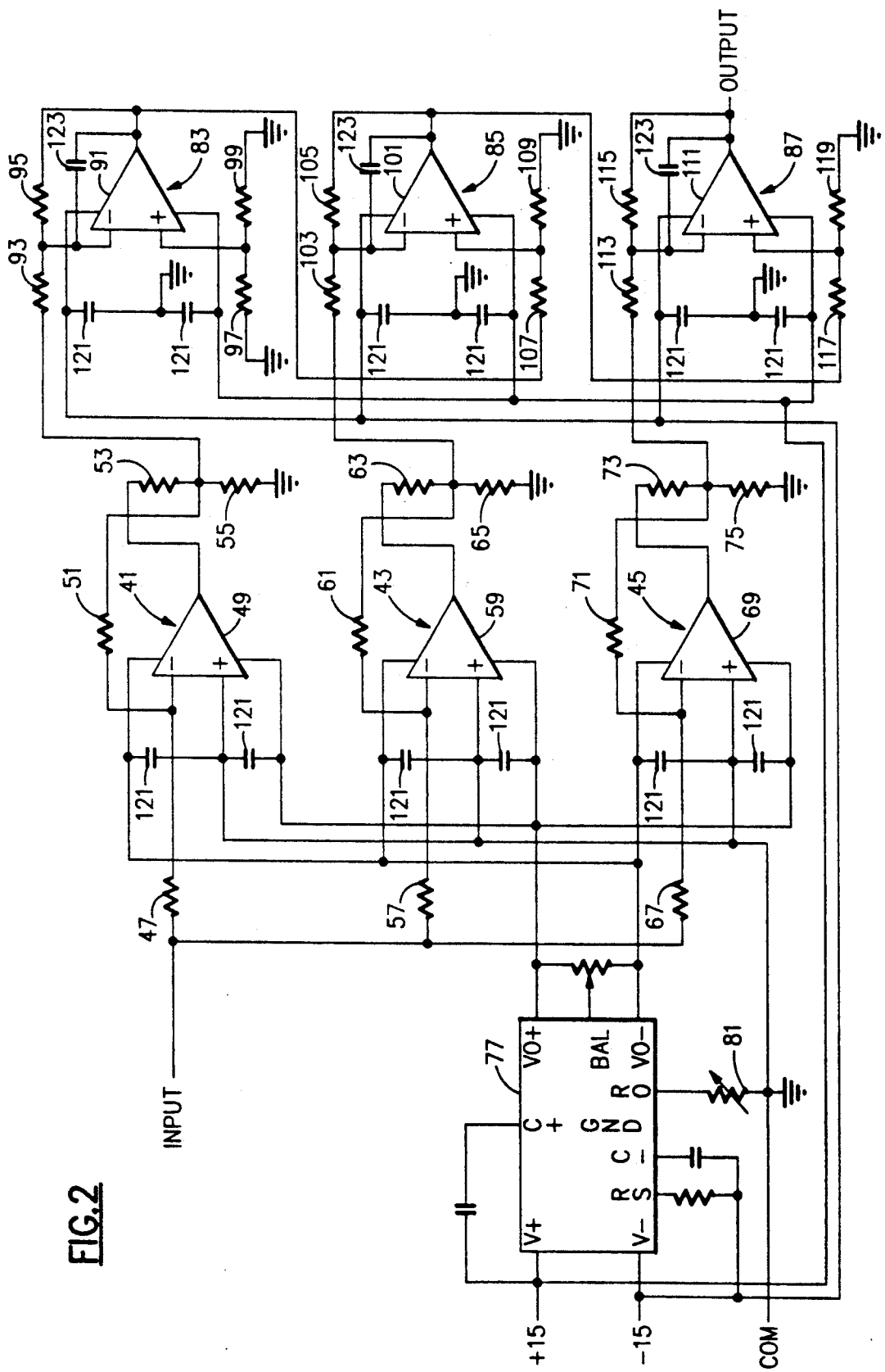
FIG. 2 is a schematic diagram representation of the block diagram of FIG. 1.

FIG. 2 shows a circuit implementation of FIG. 1. Three inverting amplifiers 41, 43, and 45, all receive the input signal provided to the PLASA. Inverting amplifier 41 comprises an input resistor 47 in series with the inverting input of an operational amplifier 49 and a feedback resistor 51 connected through a resistor 53 to the output of the operational amplifier 49. The output of the operational amplifier 49 is connected through a resistor 55 to ground. The ratio of the feedback resistor to input resistor gives the inverting amplifier a gain of 10 with the output taken from the divide by 10 voltage divider formed from resistors 53 and 55, resulting in an overall gain of 10 from the input to the output of the inverting amplifier 41 taken at the voltage divider. The output of the operational amplifier itself has a gain of 100 since the feedback resistor is connected in series with resistor 53 from the voltage divider network, reducing the feedback to the input of the operational amplifier by a factor of 10. This increases the output of the amplifier by a factor of 10.

Inverting amplifier 43 comprises an input resistor 57 in series with the inverting input of an operational amplifier 59 and a feedback resistor 61 connected through a resistor 63 to the output of the operational amplifier. The output of the operational amplifier 59 is connected through a resistor 65 to ground. The ratio of the feedback resistor 61 to input resistor 57 gives the inverting amplifier 43 a gain of 1 with the output taken from the divide-by-10 voltage divider formed from resistors 63 and 65, resulting in an overall gain of 1 from the input to the output of the inverting amplifier 43 taken at the voltage divider.

Inverting amplifier 45 comprises an input resistor in series with the inverting input of an operational amplifier 69 and a feedback resistor 71 connected through a resistor 73 to the output of the operational amplifier. The output of the operational amplifier 69 is connected through a resistor 75 to ground. The ratio of the feedback resistor 71 to input resistor 67 gives the inverting amplifier 45 a gain of 0.1 with the output taken from the divide-by-10 voltage divider formed from resistors 73 and 75, resulting in an overall gain of 0.1 from the input to the output of the inverting amplifier 45 taken at the voltage divider.

The plus and minus power supply voltages required for the operational amplifiers are provided by an adjusting trackable voltage regulator 77. The voltages provided to the operational amplifiers are adjustable by changing resistor 81 which adjusts the output voltages provided to the inverting amplifiers. The voltages supplied to the operational amplifiers are adjusted so that the output of the amplifiers is limited by saturation to 10 volts and the output from the voltage divider is limited to precisely 1 volt. With the voltages provided to the differential amplifiers precisely limited to 1 volt the output of the PLASA smoothly and continuously tracks the input voltage.

The output of each of the inverting operational amplifiers 41, 43, and 45 is connected to the inverting input terminal of a separate adder stage 83, 85, and 87, respectively. Adder stage 83 comprises a differential amplifier 91 having an input resistor 93 and a feedback resistor 95 with a ratio of 1, providing differential amplifier with a gain 1. The noninverting input of differential amplifier 91 is connected to ground separately by two equal resistors 97 and 99. The output of differential amplifier 91, which is the difference between the noninverting and the inverting inputs, is connected to an input of adder stage 85.

Adder stage 85 comprises a differential amplifier 101 having an input resistor 103 receiving the output signal from the inverting amplifier 43 and connected to the inverting input of differential amplifier 101. A feedback resistor 105 is connected from the inverting input to the output of differential amplifier with the feedback resistor 105 and the input resistor having a ratio of 1, providing differential amplifier 101 with a gain of 1. The noninverting input of differential amplifier receives the signal from the output of the first adder stage 83 through a resistor 107. The noninverting input of the differential amplifier is connected to ground through resistor 109. Resistors 107 and 109 have equal values of resistance. The output of differential amplifier 101 is the difference between the noninverting and the inverting inputs and is connected to adder stage 87.

Adder stage 87 comprises a differential amplifier 111 having an input resistor 113 receiving the output signal from the inverting amplifier 45 and connected to the inverting input of differential amplifier 111. A feedback resistor 115 is connected from the inverting input to the output of differential amplifier with the feedback resistor 115 and the input resistor having a ratio of 1, providing differential amplifier 111 with a gain of 1. The noninverting input of differential amplifier receives the signal from the output of the second adder stage 85 through a resistor 117. The noninverting input of the differential amplifier is connected to ground through resistor 119. Resistors 117 and 119 have equal values of resistance. The output of differential amplifier 111 is the difference between the noninverting and the inverting inputs and provides the output of the three stage adders 83, 85, and 87 which is the inverted sum of the output of the inverted amplifiers 41, 43, and 45.

Capacitors 121 decouple the inputs to the amplifiers 41, 43, 45, 91, 93, and 95 from the power supplies and avoid oscillations. The feedback capacitors 123, shown on the differential amplifiers, improves stability, making the amplifiers less sensitive to extraneous noise and helps avoid overshoot by providing additional positive feedback to slightly slow down the speed of response.

Referring now to FIG. 2 and Table 1, the operation of the PLASA will be described in connection with a specific application. If the voltage drop across a 100k ohm sense resistor, in series with an unknown resistance, is monitored to determine the leakage current to the unknown resistance when 500 volts is supplied through the sense resistor to the unknown resistance and a range of total resistances (leakage plus sense) between 500k and 300M is being checked, the value across the sense resistor could range from 100 volts to 0.167 volts. Conventional scaling of this signal would reduce the range of voltages so that system noise would exceed 10% of the waveform at high leakage resistances, making accurate measurement extremely difficult. Cutting off the resistance measurement at 300M ohms would not be feasible since the input offset voltages of the best analog to digital convertors would allow the cutoff point to vary across a 200M ohm range in high speed devices needed for high speed testing rates to properly capture the data. For additional details on the leakage being monitored see copending application Ser. No. 07/709,476 hereby incorporated by reference.

The psuedo logarithmic analog step adder scales each order of magnitude of input voltage from 10 to 0.01 volts, so that the entire range falls into a three volt range of 0.111 to 3.000, as shown in the table below, when three parallel amplifiers are used. Larger ranges of input signals could be accommodated by using additional amplifiers together with the associated limit network and adder stage. Scaling using the PLASA occurs quickly, in the order of nanoseconds. The decimal portion of the scaled value indicates the order of magnitude. Values of 2 or more at the output of the PLASA can be converted to their original value by subtracting 2 and multiplying the remainder by 10. Values of at least 1 but less than 2 can be converted by dropping the 1 and multiplying the decimal portion by 1/(0.11). Values less than one are converted by multiplying by 1/(1.11). The decimal portions of the output of the PLASA are proportional to the original values.

TABLE 1

| TOTAL RESISTANCE | VOLTAGE ACROSS 100K ohm SENSE RESISTOR | INPUT TO PLASA | OUTPUT from PLASA |
|---|---|---|---|
| .5M ohms | 100 volts | 10 volts | 3.000 v |
| 5M ohms | 10 volts | 1 volts | 2.100 v |
| 50M ohms | 1 volts | .1 volts | 1.110 v |
| 300M ohms | .167 | .0167 volts | 0.185 v |
| 500M ohms | .1 volts | .01 volts | 0.111 v |

Figures 4, 4A:
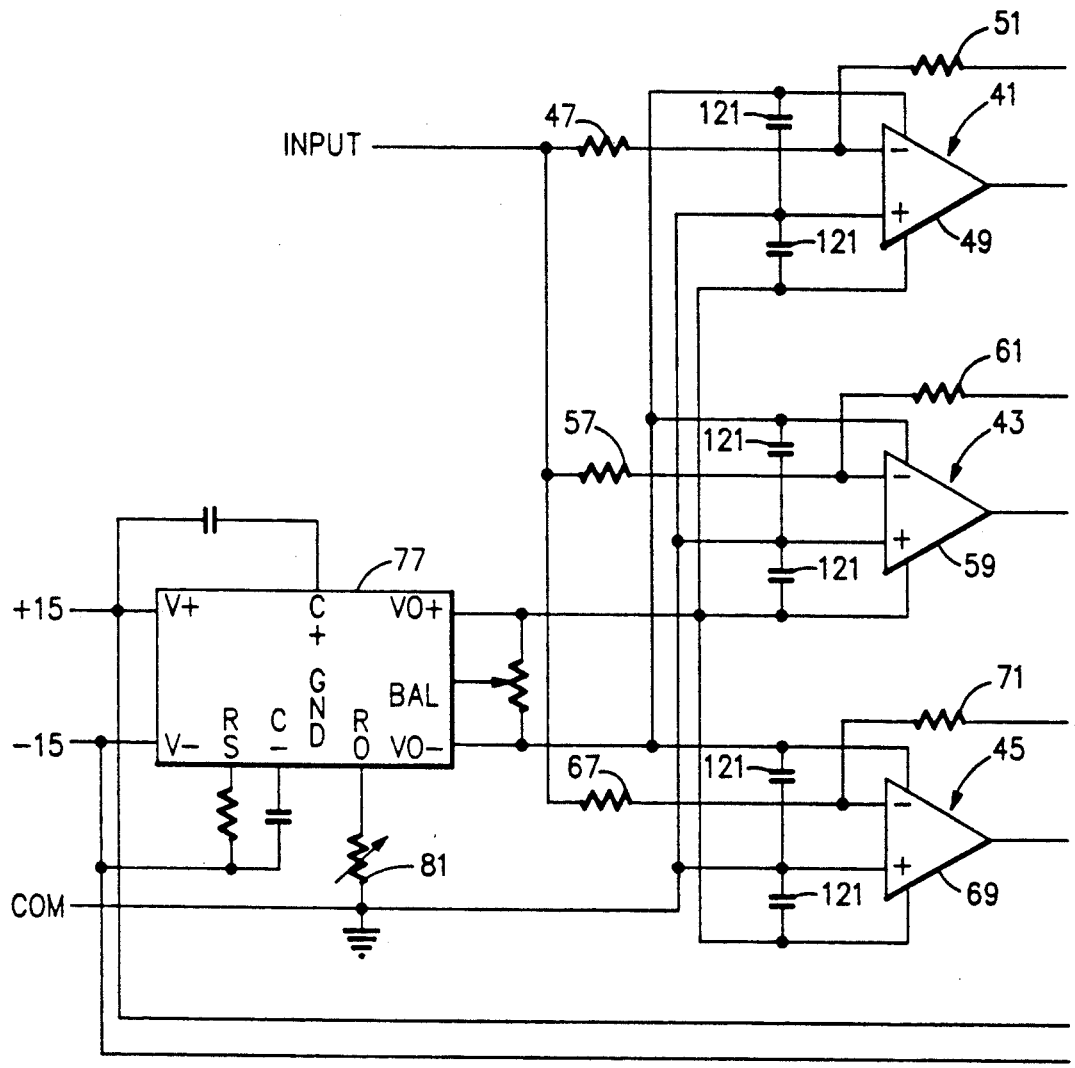
FIGS. 4A and 4B are schematic representation of another embodiment of the present invention.
Figure 4B:
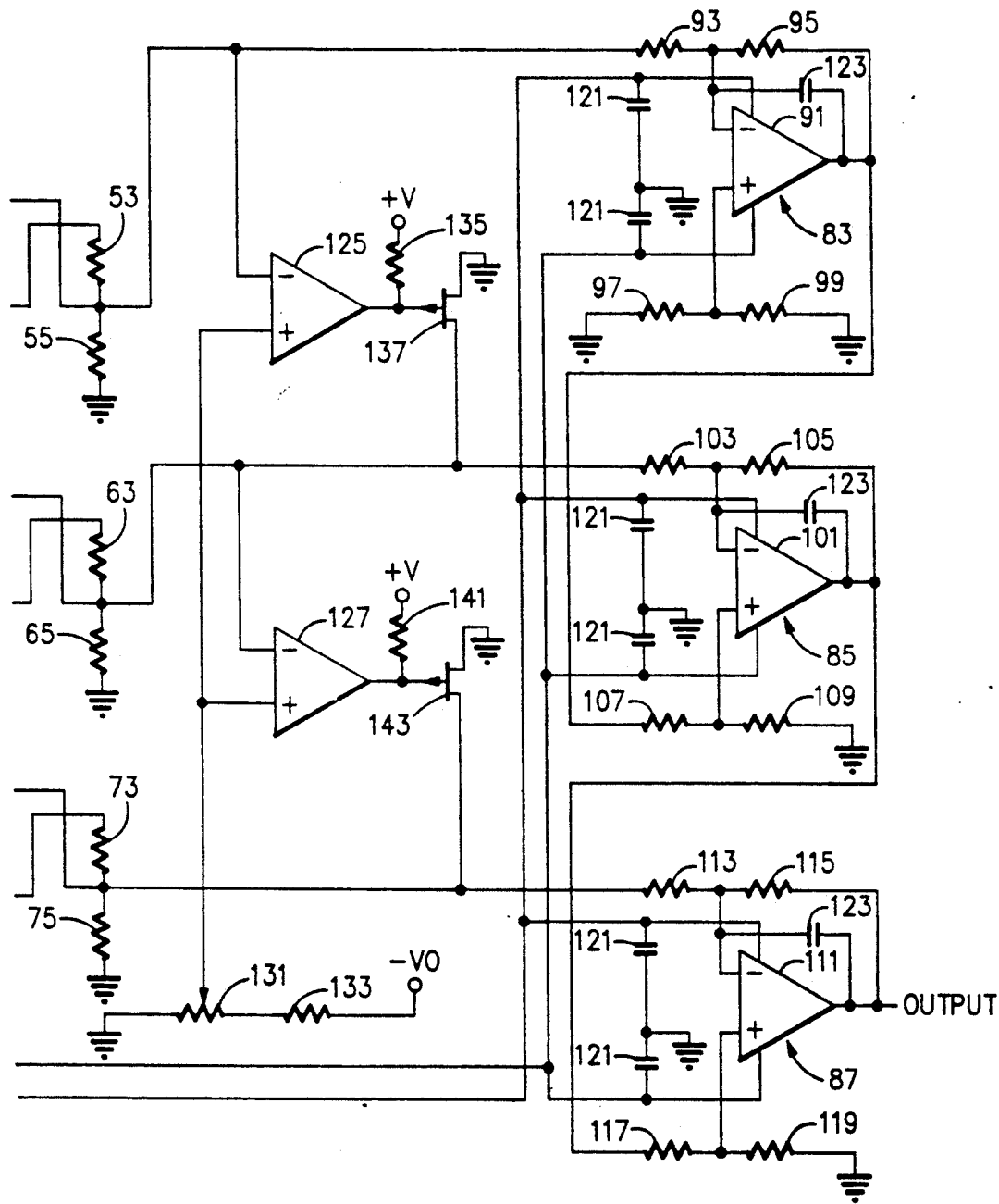

Referring now to FIGS. 4A and 4B, another embodiment of the present invention is shown. The embodiment of FIGS. 4A and 4B provides an output with the integer portion providing the decade range and the decimal portion proportional to the input signal as a power of 10. The circuit shown in FIGS. 4A and 4B has all the elements of the circuit of FIG. 2, and additional elements described below to prevent the lower gain amplifiers from providing a signal to their corresponding adder stages unless the higher gain stages are at their 1 volt limit. Comparator 125 has its inverting input connected between the output of voltage divider 53 and 55, and resistor 93. The noninverting input is connected to the variable output terminal of potentiometer 131. Potentiometer 131 is connected on one end through resistor 133 to a negative power supply voltage and the other end of the potentiometer is connected to ground. The output of comparator 125 is connected through a pull up resistor 135 to a positive power supply voltage and the output of comparator is connected to the gate of a p-channel JFET 137. The drain of the JFET is connected to ground and the source is connected to resistor 103.

Comparator 127 has its inverting input connected between the output of voltage divider 63 and 65, and resistor 103. The noninverting input is connected to the variable output terminal of potentiometer 131. The output of comparator 127 is connected through a pull up resistor 141 to a positive power supply voltage and the output of comparator is connected to the gate of a p-channel JFET 143. The drain of the JFET is connected to ground and the source is connected to resistor 103.

Referring now to FIGS. 4A and 4B and Table 2, the operation of FIGS. 4A and 4B will be described. When the input to the circuit of FIGS. 4A and 4B is zero volts, for example, the input voltage to the comparators 125 and 127 is negative causing the output of the comparators to be connected to ground. The voltage provided by the potentiometer to the noninverting inputs of the comparators is adjusted to be −1 volt. With the output of the comparator coupled to ground, the gate and drain of the JFETs are at the same potential causing them to conduct, grounding the input to the adder stages preventing signals from the amplifier stages having gains of 1 and 0.1 from reaching the adder stages. As the input voltage increases and the output of inverting amplifier 41 reaches its limit of −10 volts, the output of the divide-by-10 voltage divider 53 and 55 reaches −1 volt. The input signal to the comparator will no longer be negative and the positive voltage supplied through resistor 135 to the gate of JFET 137 will cut off the JFET. With JFET 137 cut off, the output of inverting amplifier 59 can reach its adder stage.

Similarly, when the output of inverting amplifier 59 reaches its limit of −10 volts and the output of divide-by-10 voltage divider 63 and 65 provides a −1 volt signal to the inverting input terminal of comparator 127, the comparator will switch with its output no longer coupled to ground. JFET is cut off by the positive voltage provided to its gate through resistor 141. A signal from inverting amplifier 45 can now reach its corresponding adder stage. The decimal portion of the scaled value indicates the order of magnitude. Values of 2 or more at the output of the PLASA of FIGS. 4A and 4B can be converted to their original value by subtracting 2 and multiplying the remainder by 10. Values of at least 1 but less than 2 can be converted by dropping the 1 and multiplying the decimal portion by 1.0. Values less than one are converted by multiplying by 0.1. The decimal portions of the output of the PLASA of FIGS. 4A and 4B are scaled by powers of 10 to the original values.

TABLE 2

| INPUT TO PLASA | OUTPUT from PLASA |
| --- | --- |
| 10 volts | 3.000 v |
| 1 volts | 2.100 v |
| .1 volts | 1.100 v |
| .0167 volts | 0.167 v |
| .01 volts | 0.100 v |

The foregoing has described a converter for scaling a range of input signals, which quickly converts the value to be measured and provides a scaled value which can be easily converted back to its original value.

While the invention has been particularly shown and described with reference to several embodiments thereof, it will be understood by those skilled in the art that various changes in form and detail can be made without departing from the spirit and scope of the invention.

What is claimed is:

1. A converter for scaling an input signal, comprising:
   a plurality of amplifier means having different gains, each connectable to simultaneously receive the input signal;
   a plurality of limit network means, each one of said limit network means connected to an output of a corresponding one of said amplifier means for limiting the maximum output values of all the amplifier means to a predetermined limit value; and
   adder means for summing output of all the limit network means, said adder means including a plurality of stages, one for each amplifier means, each stage connected to receive an output from a corresponding limit network means and to provide a sum of the output of the limit network plus an output of a previous stage, if any, to a next stage until a last stage is reached, whereby a scaled output signal is provided.

2. The converter of claim 1 wherein said amplifier means comprises operational amplifier.

3. The converter of claim 2, further comprising power supply means for providing a voltage which limits the saturation voltage of the operational amplifiers to a predetermined value.

4. The converter of claim 1 wherein each of said stages comprises a differential amplifier.

5. The converter of claim 1, further comprising means coupled to the output of all but the highest gain amplifier means for preventing summing of output of the lower gain amplifier means by the corresponding adder stages unless the corresponding amplifier means having a gain greater than the lower gain amplifier means is at the predetermined limit value.

6. The converter of claim 5 wherein the gains of the amplifier means are related by a factor of ten to one another.

7. The converter of claim 5 wherein said amplifier means comprises operational amplifier.

8. The converter of claim 7, further comprising power supply means for providing a voltage which limits the saturation voltage of the operational amplifiers to a predetermined value.

9. The converter of claim 1 wherein all the limit networks limit the maximum output values of each of the amplifier means same maximum value.

10. The converter of claim 1 wherein the gains of the amplifier means are related by a factor of ten to one another.

11. A converter for scaling an input signal, comprising:
   a plurality of amplifiers each including an operational amplifier having an input and a feedback resistor, and amplifiers each having a different gain, said amplifiers connectable to simultaneously receive said input signal;
   plurality of voltage divider means, comprising a first and a second resistor, connected to each corresponding output of said amplifiers to reduce the gain of the operational amplifiers;
   adder means for summing output of all said voltage divider means, whereby a scaled output signal is provided; and
   means coupled to output of all but the highest gain amplifier for preventing summing of output of the lower gain amplifiers by the adder means, unless corresponding amplifiers having gains greater than the lower gain amplifiers are at their predetermined limit value.

12. The converter of claim 11 further comprising power supply means for providing a voltage which limits the saturation voltage of the operational amplifiers to a predetermined value.

13. The converter of claim 11 wherein the gains of the amplifiers are related by a factor of ten to one another.

14. The converter of claim 11 wherein the first resistor of said voltage divider means is connected in series with the feedback resistor at one end and connected to the output of the operational amplifier at the other end.

15. The converter of claim 11 wherein said adder means comprises a plurality of stages, one for each amplifier, each stage connected to receive the output from the voltage divider means and to provide a sum of the output of the voltage divider means plus an output of a previous stage, if any, to a next stage, until a last stage is reached.

16. The converter of claim 5 wherein each of said stages comprises a differential amplifier.

* * * * *